United States Patent [19]

Castello et al.

[11] Patent Number: 4,926,138

[45] Date of Patent: May 15, 1990

[54] FULLY-DIFFERENTIAL REFERENCE VOLTAGE SOURCE

[75] Inventors: Rinaldo Castello, Arcore; Marco Ferro, Turin; Franco Salerno, Alpignano; Lucano Tomasini, Avullo, all of Italy

[73] Assignee: SGS-Thomson Microelectronics S.p.A., Catania, Italy

[21] Appl. No.: 375,771

[22] Filed: Jul. 5, 1989

[30] Foreign Application Priority Data

Jul. 12, 1988 [IT] Italy .............................. 67656 A/88

[51] Int. Cl.$^5$ .............................................. H03F 3/45

[52] U.S. Cl. .................................... 330/253; 330/257

[58] Field of Search ............... 330/252, 253, 256, 257, 330/277, 288, 289, 260, 261

[56] References Cited

U.S. PATENT DOCUMENTS 4,794,349 12/1988 Senderowicz et al. ............ 330/253

4,818,897 4/1989 Krenik ........................... 330/253 X

*Primary Examiner*—Steven Mottola

*Attorney, Agent, or Firm*—Herbert Dubno

[57] ABSTRACT

The source is apt to generate a fully-differential reference voltage at the output terminals, whereto precisely-balanced loads are applied. The voltage reference is obtained from a bandgap voltage source fed with currents proportional to the temperature, in order to minimize thermal voltage variations. Suitable circuits for starting the normal source operation after switching on are also provided.

5 Claims, 1 Drawing Sheet

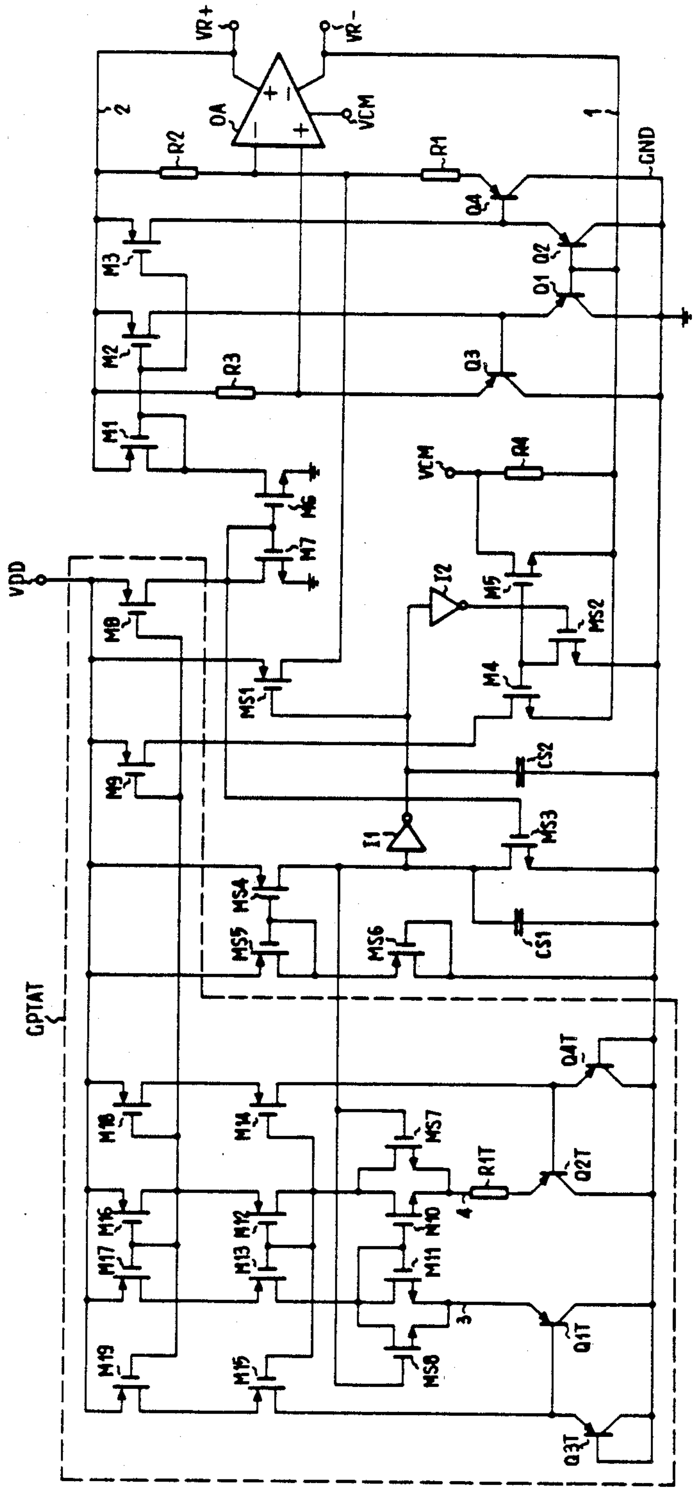
VR+
VR-
OA
VCM
R2
R1
GND
Q4
Q2
Q1
M3
M2
R3
Q3
M1
M6
M7
VDD
M8
MS1
R4
M5
I2
MS2
M4
CS2
M9
I1
MS3
MS4
MS5
MS6
CS1
GPTAT
Q4T
M18
M14
MS7
R1T
Q2T
M16
M17
M12
M13
M10
M11
Q1T
MS8
M19
M15
Q3T
1
2
3
4

FULLY-DIFFERENTIAL REFERENCE VOLTAGE SOURCE

DESCRIPTION

The present invention relates to integrated circuits technology and more particularly it concerns a fully-differential reference voltage source.

As known, fully-differential circuits for implementing high precision analog circuits, namely filters, analog-to-digital and digital-to-analog converters and the like, have been recently developed. More particularly, a hybrid CMOS technology has been developed, wherein the same substrate is shared among analog and digital circuits.

This tendency is due to the higher immunity of those differential circuits to the noise present on the power supply lines and to doubled dynamic range due to the use of complementary output voltages. Differential circuit advantages are particularly evident when a unique low-value power supply voltage is available.

A precision reference voltage source, which is an analog circuit commonly used in hybrid CMOS technology systems, can be particularly advantageous if implemented in a differential version. In fact, in this case it can be directly connected to the other differential blocks presenting a higher noise-immunity, more particularly at high frequencies.

In integrated circuit technology various voltage sources are known which exploit as a primary reference voltage the bandgap voltage of parasitic bipolar transistors, usually present in a standard CMOS technology. As known, bandgap voltage is the voltage obtainable by eliminating from a transistor base-emitter voltage, the portion that in first approximation varies in a way inversely proportional to the temperature. This part is eliminated, at a certain temperature, by subtraction from a voltage which varies proportionally to the temperature and which is obtained as a difference between two, or four, or six etc. base-emitter voltages, multiplied by a suitable coefficient.

Known reference voltage sources, exploiting such bandgap voltage, supply at the output a positive or a negative voltage with respect to a certain reference potential, which can be that of power supply or ground, but they cannot supply fully-differential voltages. See e.g. the article entitled "Bandgap voltage reference sources in CMOS technology" Electronics Letters, vol. 18, No. 1, 7 Jan. 1982, by R. Ye and Y. Tsividis.

Another disadvantage presented by known voltage sources resides in their sensitivity to the offset voltage of the operational amplifier implementing the circuit. Different solutions have been suggested to reduce this temperature-dependent voltage error. According to a first solution, described in the article entitled "A Programmable CMOS Dual Channel Interface Processor for Telecommunications Applications", IEEE Journal of Solid-State Circuits, vol. SC-19, pages 892–899, December 1984, by Bhupendra K. Ahuja et alii, the absolute value of primary reference voltage is increased by a series of several bipolar transistors. Said transistors must be biased by a mirror current circuit driven by the operational amplifier. The primary reference voltage is extracted from a transistor drain, which is a high impedance output, that is why only a very low current can be extracted.

Another solution makes use of particular circuits which exploit switched-capacitor technique: see e.g. the article "A precision curvature-compensated bandgap reference", IEEE Journal of Solid-State Circuits, vol. SC-18, pagg. 634–643, December 1983, by B. S. Song and P. R. Gray. In this circuit offset voltage value is periodically stored in a capacitor and then substracted from the primary reference voltage. However, by this technique reference voltage is available only at periodical time intervals, that is why it is not convenient whenever continuous availability is required or sampling rate is very high.

The disadvantages above are overcome by the fully-differential reference voltage source provided by the present invention, which is easy to integrate, presents low impendance outputs, with balanced common-mode loads, and wherein error contribution due to offset voltages and high-frequency noises, present on the power supply line is minimized.

The present invention provides a fully-differential reference voltage source, as described in claim 1.

The foregoing and other characteristics of the present invention will be made clearer by the following description of a preferred embodiment thereof, given by way of a non-limiting example, and by the annexed drawing representing the electrical diagram of the reference voltage source.

In the present embodiment, the operational amplifier used is of the fully-differential type with low impedance outputs and the desired bandgap voltage is obtained as the difference between its output voltages, whose common-mode value results controlled by the feedback circuit of the amplifier itself.

Q1, Q2, Q3, and Q4 on the FIGURE denote four bipolar transistors forming voltage source $\Delta$Vbe. Their collectors are connected to ground conductor GND and are connected so that Q1 and Q1 emitters drive Q3 and Q4 bases respectively, whilst Q1 and Q2 bases are connected to each other and to wire 1. This wire is in turn connected to the inverting output of the operational amplifier QA and to terminal VR−, whereupon the negative polarity of the reference voltage is available. Such bipolar transistors are commonly available as parasitic components in CMOS N-WELL technology.

Transistors M1, M2 and M3 form a current mirror fed by the current present at the operational amplifier non-inverting output, connected to wire 2 and terminal VR+, whereupon the positive polarity of the reference voltage is present. The current supplied by non-inverting OA output biases through transistor M2 Q1 emitter, through transistor M3 Q2 emitter, through resistor R3 Q3 emitter and through resistors R1 and R2 placed in series Q4 emitter. The point common to resistor R3 and Q3 emitter is connected to the non-inverting input and the common point to R1 and R2 resistors is connected to the inverting input of operational amplifier OA. The amplifier is also equipped with a input VCM for a voltage to be used as a reference for the output common-mode voltage adjustment. Resistors R2 and R3 are equal.

Transistors Q2 and Q4 are formed by connecting in parallel ten transistors equal to Q1 or Q3, thus obtaining in each of them an emitter current equal to a tenth of the current flowing through Q1 or Q3. As a consequence voltage Vbe between base and emitter of Q2 or Q4 is lower by about 60 mV than Vbe of Q1 or Q3 and the potential difference established at the R1 terminals, taking into account that the voltage between the amplifier inputs is null, is equal to 120 mV. The current traversing R1 is then 120/R1 mA, equal to the current traversing R2 and R3.

The current suplied by M2 and M3, in the following called PTAT, is equal to that traversing M1, which is driven by transistor M6, which with transistor M7 forms another current mirror. The current which traverses M7 is set by transistor M8, which is in turn driven by a third current mirror, which is formed by transistors M12, . . . , M19 and is fed by power supply voltage VDD.

The latter current mirror comprises four branches, each consisting of two transistors placed in "cascode" configuration. More precisely, the four branches are formed by pairs M18-M14, M16-M12, M17-M13 and M19-M15, which are traversed by four currents equal to PTAT. The pair M16-M12 forms the branch driving the mirror, as it receives through transistor M10 the current from a circuit network comprising transistors Q1T, Q2T, Q3T, and Q4T. This network implements a voltage source ΔVbe and is the replica of the structure consisting of Q1, Q2,Q3 and Q4. Bipolar transistors Q1T,Q2T,Q3T and Q4T have the collectors connected to ground terminal GND. Q3T and Q4T have also the bases grounded and the emitters connected to the bases of Q1T and Q2T respectively. The emitters of Q1T and Q2T are connected to branches M17-M13 and M16-M12 of the current mirror through the channel of a transistor M11 and the series formed by resistor R1T and M10. Transistors M10 and M11 are equal to each other and R1T is equal to R1.

Transistors M8, . . . , M19, Q1T, . . . , Q4T form the source of current PTAT proportional to the temperature and are surrounded in the FIGURE by a dashed line denoted by GPTAT. Let us see now how the value of current PTAT in the mirror input branch M12-M16 is determined. Transistors M10 and M11, since they are traversed by the same currents and are equal, cause the same potential to be present on wires 3 and 4 with respect to ground conductor GND. That is why between wires 3 and 4 there is no potential difference. The voltage across the terminals of R1T is then given by the difference between base-emitter voltages Vbe of transistors Q1T, Q3T, Q2T, Q4T. Even in this case Q2T and Q4T consist of ten transistors equal to Q1T and Q3T placed in parallel. The current traversing each of them is then equal to a tenth of that which traverses Q3T or Q4T, that is why voltage ΔVbe between the base and the emitter of transistors Q2T and Q4T differs by about 60 mV from that of Q1T and Q3T. A current equal to 120/R1T mA which is proportional to the absolute temperature is then obtained in R1T. This current PTAT is sent through M10 and branch M16-M12 to the current mirror and replicated in M8, in the mirror M7-M6, in the mirror M1-M2-M3 and in transistors Q1 and Q2.

In this way, the current flowing through Q1 and Q2 is equal to that flowing through Q3 and Q4 and presents a similar variation with temperature, that is why reference voltage variations result minimized and final adjustment is easied.

Reference voltage Vr across outputs VR+, VR− of the operational amplifier is given by $$Vr=2\ Vbe+(2\ \Delta Vbe\pm Vos)(1+R2/R1)$$

where ΔVbe is the difference between Vbe voltages of transistors Q1, Q2, Q3 and Q4 and Vos is the offset voltage at the input of operational amplifier OA. Since Vbe decreases quasi-linearly with absolute temperature and ΔVbe linearly increases, by a suitable choice of ratio R2/R1 voltage Vr can be rendered independent from the temperature. A particularly convenient value of said ratio is equal to about 9. The influence of voltage Vos, already rendered negligible by the presence of two ΔVbe, can be further minimized by taking it into account during the adjustment phase of the integrated circuit.

Let us see now how load symmetry at the outputs VR+ and VR− of the operational amplifier is obtained. This characteristic allows a better common-mode noise rejection of the amplifier, more particularly as far as power-supply line noises are concerned.

The current outgoing from VR+ is equal to five times current PTAT, proportional to absolute temperature, flowing through the individual branches of the bandgap source, i.e. in R2, R3, M2, M3 and M1. Besides the load present at VR+ can be considered connected at the other end to the common-mode voltage, which, in case of a fully-differential operational amplifier, is equal both at the input and at the output and is generally fixed to a value equal to half the power supply voltage. It is then necessary to apply to the output VR− a load absorbing the same current, which refers to the common mode voltage and presents a similar temperature behaviour.

That is obtained by connecting between wire 1 and the terminal connected to common-mode voltage VCM both a resistor R4, with a resistance equal to the parallel of those of R2 and R3, so as to obtain a current equal to the sum of those flowing in R2 and R3, and a transistor M5. This transistor is part of a current mirror comprising also transistor M4, traversed by current PTAT set by transistor M9, belonging to the mirror comprising M8, M12, . . . , M19 already examined. Transistor M5 has an area which is twice as large as that of M4, that is why a current twice as high flows. Hence in M4 and M5 currents flow equal to three times PTAT current, in R4 a current twice as high as PTAT, that is why total current flowing in wire 1 at the output VR− is equal to five times PTAT, as that at the output VR+. Base currents of Q1 and Q2 are negligible.

Self-biased circuits, as current source PTAT or the bandgap voltage source, present two possible stable operating points: a normal one and a spurious one wherein all the currents are equal to zero. To ensure that at switching on the circuits get all self-biased always in the normal operating point, a circuit has been added intervening at the beginning of the functioning of the source and hence is cut off.

The circuit comprises transistor MS3, with grounded source, gate connected to common point between M7 and M8 and drain connected to the drain of another transistor MS4. The latter has the source connected to power supply VDD and the gate biased by two transistors MS5 and MS6 connected as diodes. The common point between MS3 and MS4 is connected to the gates of two transistors MS7 and MS8 placed in parallel with transistors M10 and M11 respectively. If upon switching on no current flows in the branches of the mirror formed by M8, . . . , M19, the voltage at the common point between M7 and M8 is null, with the exception of a low threshold voltage, that is why MS3 is cut-off. Transistor MS4, which is certainly biased by two diodes MS5 and MS6, works in the linear zone of its voltampere characteristics, that is why its drain is at a potential near VDD and MS7 and MS8 are conducting: as a consequence, a current is set in branches M12-M16 and M13-M17 of the current mirror. Also in the other mirror branches, and more particularly in M7, current flows which soon takes up the value PTAT, forcing MS3 to conduct and hence cutting off MS7 and MS8: in fact MS3 size is much greater than MS4.

From that instant on, MS7 and MS8 do not disturb any longer the normal operation of current source PTAT. Capacitor CS1 placed between MS3 and MS4 drains is used to compensate the loop gain of the amplifier composed of the same transistors MS3 and MS4.

Also the bandgap voltage source needs a circuit to overcome possible initial transients upon switching on. This circuit consists of an inverter I1, whose input is connected to MS3 drain and whose output drives a capacitor CS2 and a transistor MS1. This transistor has the source connected to power supply voltage VDD and the drain to the common pont between the two resistors R1 and R2. Capacitor CS2 introduces a certain delay to state change at output of I1, which passes to high level after the amplifier OA has reached the steady condition. The low level at MS1 gate makes current flow in MS1, in R1 and Q4. Thus voltage at the inverting input of the operational amplifier rapidly approximates the normal functioning value, shortening the transient.

Inverter I1 drives also another inverter I2, which in turn drives the gate of transistor MS2 with grounded source and drain connected to the gates of M4 and M5. This circuit is used to reduce the time necessary to operational amplifier OA to reach the steady common-mode voltage. In fact in the initial phase, when the level at the output of I1 is low, the level at the output of I2 is high and MS2 is conducting. As a consequence M4 and M5 result cut off, preventing voltage on Q1 and Q2 bases from exceeding common-mode voltage VCM.

It is clear that what described has been given only by way of non-limiting example. Variations and modifications are possible without going out of the scope of the present claims.

We claim:

1. A fully-differential reference voltage source comprising:

a source (GPTAT) of current proportional to temperature (PTAT) comprising a first current mirror (M8, . . . , M19) feeding a first voltage source ΔVbe (Q1T, . . . , Q4T);

a second voltage source ΔVbe (Q1, . . . , Q4), with a structure equal to that of the first;

an operational amplifier (OA) whose inputs are connected to the outputs of the second voltage source ΔVbe;

characterized in that it further comprises:

a second current mirror (M6,M7) which is driven by the current (PTAT) it receives from said first current mirror (M8, . . . , M19);

a third current mirror (M1,M2,M3), which is driven by current (PTAT) it receives from said second current mirror (M6,M7) and feeds a first and a second transistor (Q1,Q2) of said second voltage source ΔVbe, a third and a fourth transistor (Q3,Q4) being fed with the same current (PTAT) respectively by a first resistor (R3) and by a series of a second and third resistor (R1,R2);

and in that said operational amplifier (OA) is provided both with a differential non-inverting output (VR+) feeding the third current mirror (M1,M2,M3), the first resistor (R3) and the series of the second and third resistor (R1,R2) and with a differential inverting output (VR−) supplying bases of said first and second transistor (Q1,Q2), the inverting and non-inverting inputs being connected to outputs of the second source of voltage ΔVbe.

2. A fully-differential reference voltage source as in claim 1, characterized in that the differential inverting output (VR−) of the operational amplifier (OA) is connected to a fourth resistor (R4) with resistance equal to the parallel of said first and third resistor (R3,R2) and to a fourth current mirror (M4,M5) which sets a current equal to three times the current (PTAT) supplied by said source (GPTAT).

3. A fully-differential reference voltage source as in claim 1, characterized in that it comprises a fifth transistor (MS3), with a grounded source, a gate connected to the input of said second current mirror (M6,M7) and drain connected to a drain of a sixth transistor (MS4), which has its source connected to a power supply (VDD) and its gate biased by a seventh and eighth transistor (MS5,MS6) connected as diodes, the common point between the fifth (MS3) and the sixth (MS4) transistor sending current into one of the branches of the first current mirror for a short time period after switching on.

4. A fully-differential reference voltage source as in claim 3, characterized in that it comprises a first inverter (I1), whose input is connected to the common point between the fifth (MS3) and the sixth (MS4) transistor, and whose output drives a capacitor (CS2) and and a ninth transistor (MS1) whose source is connected to power-supply voltage (VDD) and whose drain to the common point between said second and third resistor (R1,R2), whereinto it sends current for a short time after switching on.

5. A fully-differential reference voltage source as in claim 4, characterized in that it comprises a second inverter (I2), whose input is connected to the output of said first inverter (I1) and whose output drives a tenth transistor (MS2) which cuts off said fourth current mirror (M4,M5) for a short time period after switching on.

* * * * *